(12) United States Patent
Rim et al.

(10) Patent No.: US 9,165,929 B2
(45) Date of Patent: Oct. 20, 2015

(54) COMPLEMENTARILY STRAINED FINFET STRUCTURE

(71) Applicant: QUALCOMM Incorporated, San Diego, CA (US)

(72) Inventors: Kern Rim, San Diego, CA (US); Jeffrey Junhao Xu, San Diego, CA (US); Stanley Seungchul Song, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/322,207

(22) Filed: Jul. 2, 2014

(65) Prior Publication Data

US 2015/0144962 A1 May 28, 2015

Related U.S. Application Data

(60) Provisional application No. 61/908,625, filed on Nov. 25, 2013.

(51) Int. Cl.
*H01L 27/12* (2006.01)
*H01L 27/092* (2006.01)
*H01L 21/84* (2006.01)
*H01L 21/8238* (2006.01)
*H01L 29/10* (2006.01)
*H01L 29/16* (2006.01)
*H01L 29/161* (2006.01)

(52) U.S. Cl.
CPC .... *H01L 27/0924* (2013.01); *H01L 21/823821* (2013.01); *H01L 29/1054* (2013.01); *H01L 29/161* (2013.01); *H01L 29/1608* (2013.01)

(58) Field of Classification Search
CPC ............ H01L 27/0924; H01L 29/1608; H01L 29/161; H01L 29/1054; H01L 21/83821; H01L 21/823821
USPC ...................... 257/24, 77, 190, 351, 353, 369, 257/E27.062, E27.112, E29.004, E29.255, 257/E21.09, E21.632, E21.033; 438/153, 438/198, 199, 478
See application file for complete search history.

(56) References Cited

U.S. PATENT DOCUMENTS

| | | | |
|---|---|---|---|
| 7,388,259 | B2 | 6/2008 | Doris et al. |
| 7,626,246 | B2 | 12/2009 | Lochtefeld et al. |
| 7,807,525 | B2 | 10/2010 | Doris et al. |
| 7,863,646 | B2 | 1/2011 | Belyansky et al. |

(Continued)

FOREIGN PATENT DOCUMENTS

WO 2013154574 A1 10/2013

OTHER PUBLICATIONS

International Search Report and Written Opinion—PCT/US2014/061204—ISA/EPO—Jan. 13, 2015.

*Primary Examiner* — Dao H Nguyen
(74) *Attorney, Agent, or Firm* — Seyfarth Shaw LLP

(57) ABSTRACT

A complementary fin field-effect transistor (FinFET) includes a p-type device having a p-channel fin. The p-channel fin may include a first material that is lattice mismatched relative to a semiconductor substrate. The first material may have a compressive strain. The FinFET device also includes an n-type device having an re-channel fin. The n-channel fin may include a second material having a tensile strain that is lattice mismatched relative to the semiconductor substrate. The p-type device and the n-type device cooperate to form the complementary FinFET device.

16 Claims, 9 Drawing Sheets

(56) References Cited

U.S. PATENT DOCUMENTS

| | | |
|---|---|---|
| 8,338,889 B2 * | 12/2012 | Kaneko et al. ................ 257/351 |
| 2005/0130358 A1 | 6/2005 | Chidambarrao et al. |
| 2006/0131699 A1 | 6/2006 | Raab et al. |
| 2008/0006908 A1 | 1/2008 | Lin et al. |
| 2008/0020515 A1 | 1/2008 | White et al. |
| 2010/0213553 A1 | 8/2010 | Hargrove et al. |
| 2011/0037125 A1 * | 2/2011 | Cheng et al. .................. 257/351 |
| 2011/0309333 A1 * | 12/2011 | Cheng et al. .................... 257/24 |
| 2012/0001266 A1 * | 1/2012 | Lim et al. ...................... 257/369 |
| 2013/0337637 A1 * | 12/2013 | Cheng et al. .................. 438/478 |
| 2014/0027860 A1 | 1/2014 | Glass et al. |
| 2014/0264348 A1 * | 9/2014 | Tsai et al. ....................... 257/57 |

* cited by examiner

COMPLEMENTARILY STRAINED FINFET STRUCTURE

CROSS-REFERENCE TO RELATED APPLICATION

This application claims the benefit under 35 U.S.C. §119 (e) to U.S. Provisional Patent Application No. 61/908,625 entitled "COMPLEMENTARILY STRAINED FINFET STRUCTURE," filed on Nov. 25, 2013, the disclosure of which is expressly incorporated by reference herein in its entirety.

BACKGROUND

1. Field

Aspects of the present disclosure relate to semiconductor devices, and more particularly to complementary strain materials in field effect transistor (FET) structures using fin (FinFET) channels.

2. Background

Strain engineering for FET performance has been viewed as an alternative to reducing gate oxide thickness. In standard FET geometries, imparting a strain in semiconductor chip regions, such as the source and drain regions of a FET, is an approach employed in the related art. In FinFET structures, however, the volume of the fin available for strain engineering is small. In addition, the compressive strain along the channel direction that is beneficial for p-channel (e.g., hole charge carriers) FinFETs is detrimental to the n-channel (e.g., electron charge carriers) FinFETs. The volume and compressive strain issues have limited the ability to apply strain engineering in FinFET devices.

SUMMARY

A method for fabricating a complementary fin field effect transistor (FinFET) device on a semiconductor substrate in accordance with an aspect of the present disclosure includes processing a first material having a compressive strain to fabricate a p-type fin device on the semiconductor substrate. Such a method also includes processing a second material having a tensile strain to fabricate an n-type fin device on the semiconductor substrate, in which the p-type fin device and the n-type fin device cooperate to form the complementary FinFET device.

A complementary fin field-effect transistor (FinFET) device in accordance with another aspect of the present disclosure includes a p-type device having a p-channel fin comprising a first material that is lattice mismatched relative to a semiconductor substrate, the first material having a compressive strain. Such a device also includes an n-type device having an n-channel fin comprising a second material having a tensile strain and being lattice mismatched relative to the semiconductor substrate, in which the p-type device and the n-type device cooperate to form the complementary FinFET device.

A complementary fin field-effect transistor (FinFET) device in accordance with another aspect of the present disclosure includes a p-type device having means for carrying current comprising a first material that is lattice mismatched relative to a semiconductor substrate, the first material having a compressive strain. Such a device further includes an n-type device having means for carrying current comprising a second material having a tensile strain and being lattice mismatched relative to the semiconductor substrate, in which the p-type device and the n-type device cooperate to form the complementary FinFET device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A high mobility conduction channel is desirable for high performance transistors. Material selection and strain engineering are design features that may alter the mobility of charge carriers in the channel of transistors. Strain engineering is used in metal-oxide-semiconductor (MOS) field effect transistors (MOSFETs). In fin-based structures (e.g., Fin-FETs), however, the use of strained materials is challenging. In particular, there are more free surfaces in FinFET structures. As a result, the source/drain volume available for strain engineering is small compared to other FET geometries and techniques.

Strained silicon germanium (SiGe), silicon germanium carbon (SiGe:C), or germanium (Ge) are possible candidates for a strained, high mobility channel in p-channel FETs. These materials, however, often reduce the electron mobility in re-channel FETs because these materials are under compressive strain. In addition, NFET charge transport properties in strained (biaxial or uniaxial) SiGe are often worse than in a silicon (Si) channel.

One aspect of the present disclosure describes a structure that imparts compressive strain on P-channel FinFETs, while imparting complementary tensile strain on N-channel FinFETs to improve the performance of both polarity FETs. One aspect of the present disclosure employs SiGe in the p-channel fin structure, and silicon-carbon (Si:C) in the n-channel fin structure to provide complementary FET structures. The use of a complementary strain (e.g., tensile v. compressive) integrates both polarities of strain in a single chip. Integrating both polarities of strain in a single chip increases the mobility of carriers in both polarities of transistors. Further, because different materials are used for each polarity, the PFET and NFET strains may be independently designed/tuned for each device type.

Figure 1:
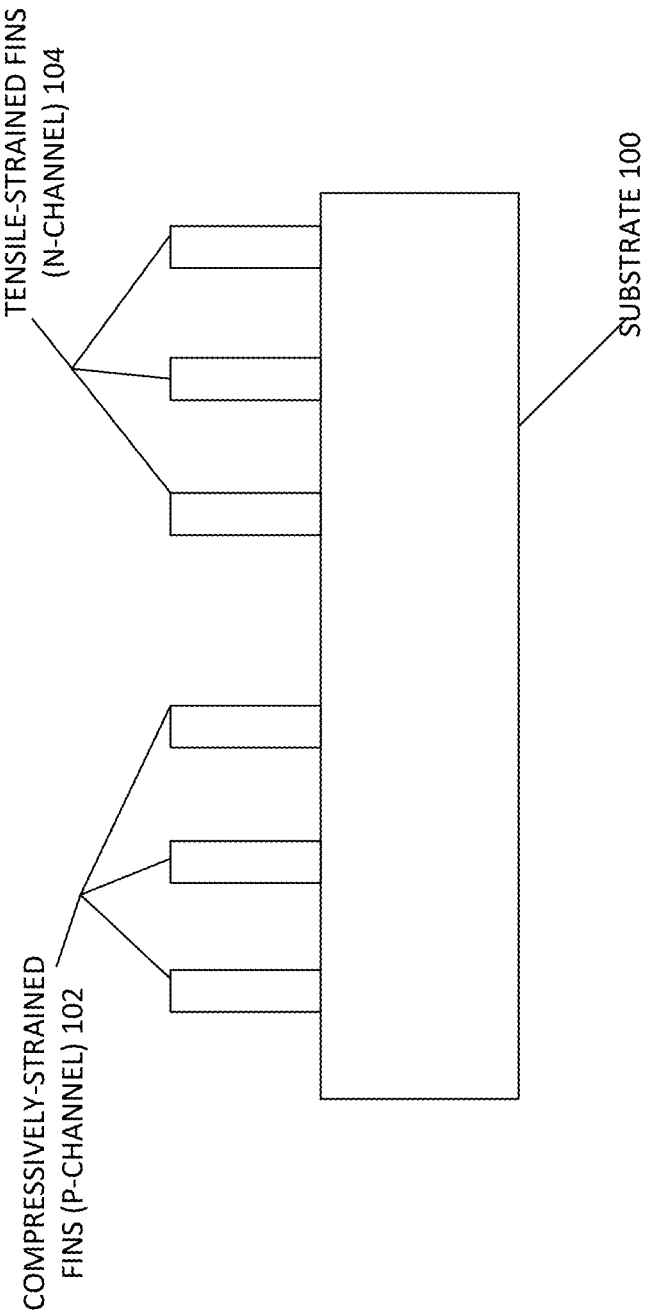
FIG. 1 illustrates a side view of a semiconductor device in an aspect of the present disclosure.

FIG. 1 illustrates a side view of a semiconductor device in an aspect of the present disclosure. In particular, a substrate 100, compressively-strained fin structures 102, and tensile-strained fin structures 104 are shown. The substrate 100 may be a silicon substrate or other like supporting layer, for example, comprised of an oxide layer, a nitride layer, a metal oxide layer or a silicon layer. The compressively-strained fin structures 102 may be SiGe, SiGe:C, Ge, or other materials that provide higher hole mobility as compared to doped substrate materials. If the compressively-strained fin structures 102 contain Ge, the percentage of Ge in the fins may be from about 10% to about 100%. The tensile-strained fin structures 104 may be Si:C, or other materials that provide higher electron mobility as compared to doped substrate materials. If the tensile-strained fin structures 104 are Si:C, the carbon percentage may range from about 0.5% to about 5%.

Figure 2:
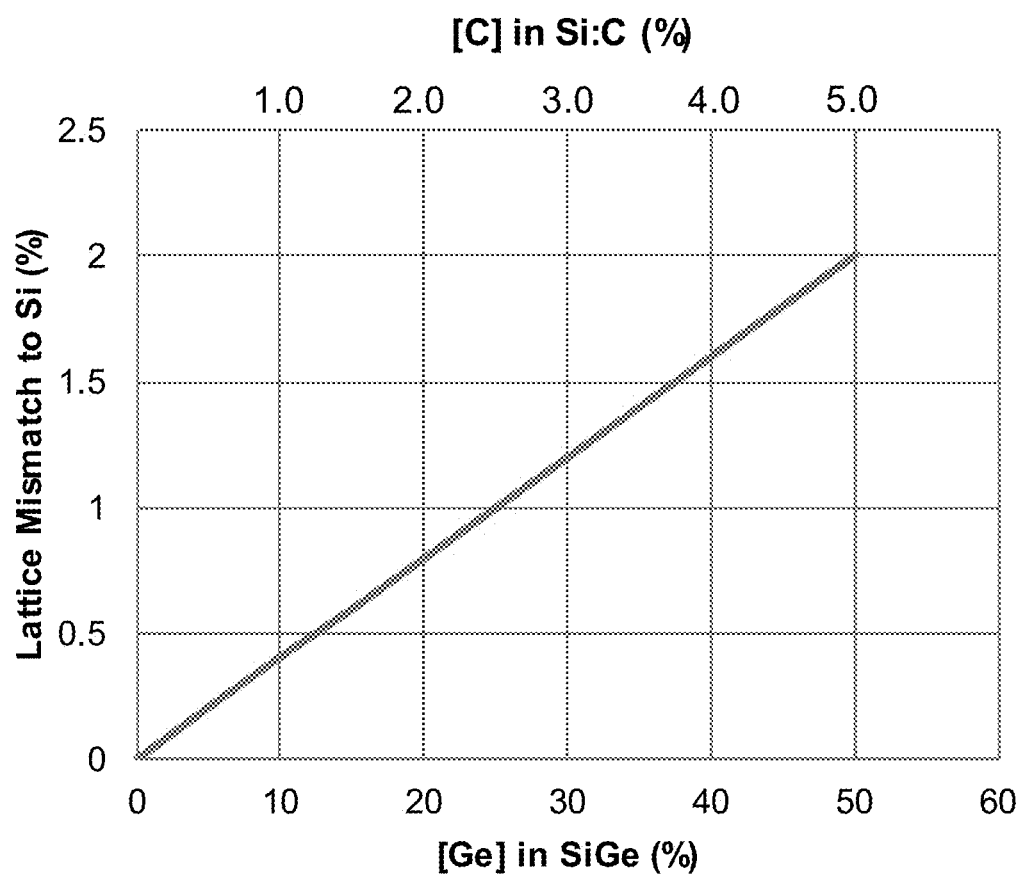
FIG. 2 illustrates a lattice mismatch between a semiconductor substrate and different materials in an aspect of the present disclosure.

FIG. 2 illustrates the lattice mismatch for materials in accordance with one aspect of the present disclosure. The lattice mismatch and the resulting strain are proportional to [Ge] and [C] in SiGe and Si:C respectively. The compressively-strained fin structures 102 and tensile-strained fin structures 104 may be pseudomorphic to the lattice of the substrate 100 underlying the fin structures. In another aspect of the present disclosure, the lattice mismatch may be with an intervening layer on the substrate 100. This intervening layer may be an oxide layer, a nitride layer, a metal oxide layer, or other like intervening layer. This lattice mismatch with the substrate 100 causes the strain in the compressively-strained fin structures 102 and the tensile-strained fin structures 104, respectively.

Figure 3:
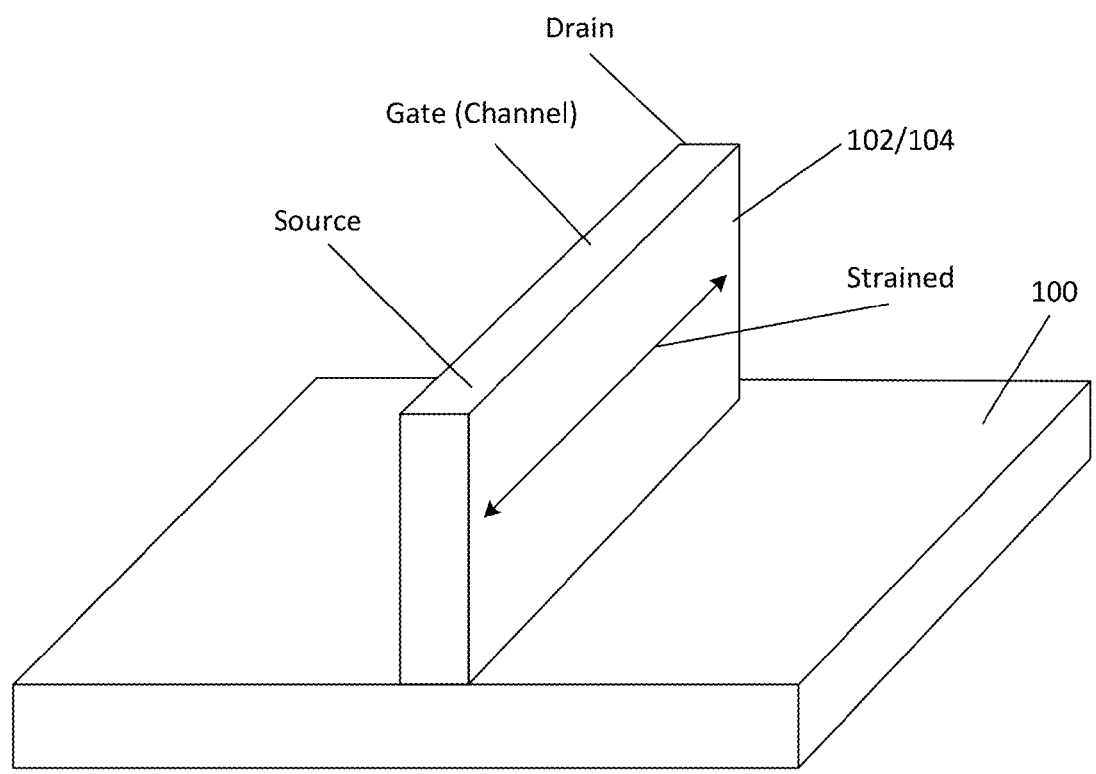
FIG. 3 illustrates a perspective view of a fin structure in an aspect of the present disclosure.

FIG. 3 illustrates a perspective view of a fin structure in an aspect of the present disclosure. In this configuration, a strain of the fin structure is anisotropic because the strain is substantially directed along the fin length between the source and drain. In this configuration, the geometry of the compressively-strained fin structures 102 and the tensile-strained fin structures 104 relaxes the strain in the height and width directions. The remaining strain along the length of the compressively-strained fin structures 102 and the tensile-strained fin structures 104 is tensile for Si:C and compressive in SiGe.

Figure 4A:
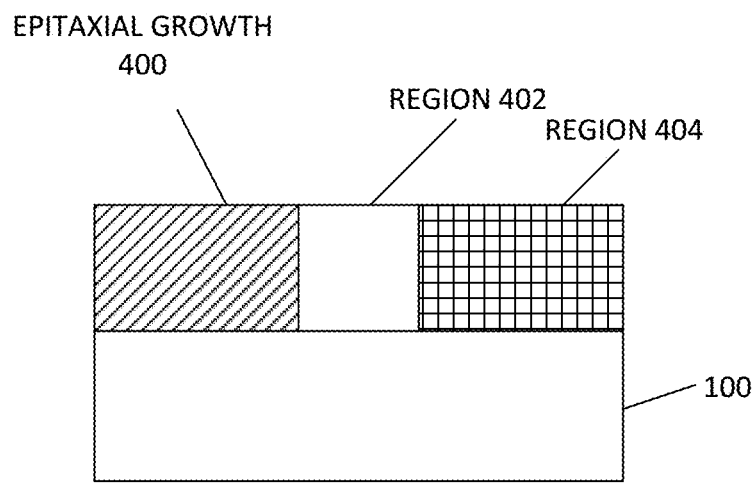
FIGS. 4A and 4B illustrate a method of making an integrated device according to an aspect of the present disclosure.
Figure 4B:
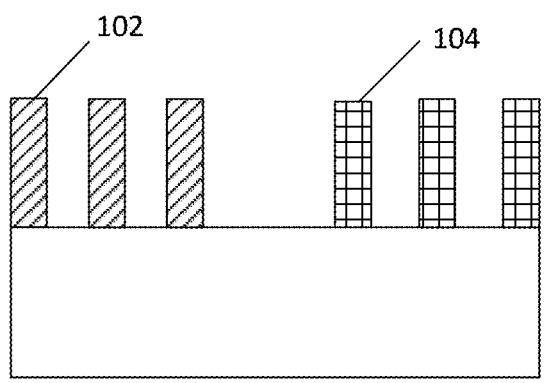

FIGS. 4A and 4B illustrate a method of making an integrated device according to an aspect of the present disclosure. In FIG. 4A, the substrate 100 has a region of epitaxial growth 400 that is a compressively-strained material. A region 402 is an area of isolation material such as silicon oxide. A region 404 of the tensile-strained material is epitaxially grown. In FIG. 4B, the regions are selectively etched to create the compressively-strained fin structures 102 and the tensile-strained fin structures 104.

Figure 5A:
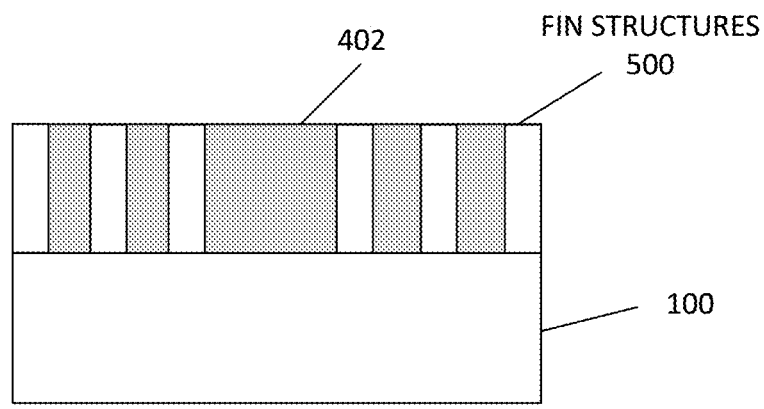
FIGS. 5A-5D illustrate another method of making an integrated device according to an aspect of the present disclosure.
Figure 5B:
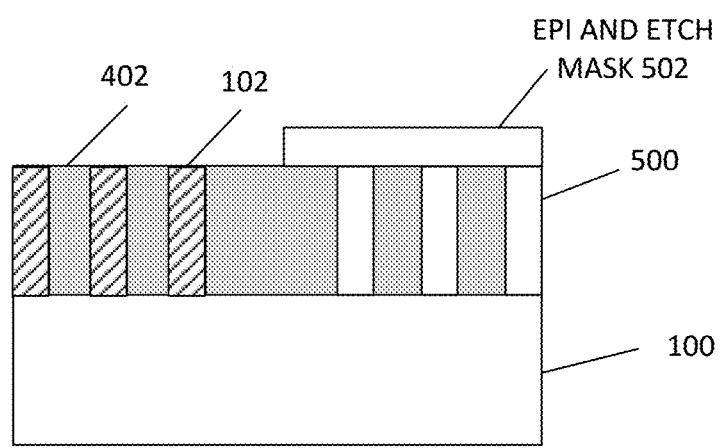

FIGS. 5A-5D illustrate another method of making an integrated device according to an aspect of the present disclosure. Fin structures 500 are fabricated on the substrate 100, with isolation material in region 402 filling the volume between the fin structures 500. An epi (epitaxy) and etch mask 502 is applied over some of the fin structures 500, and one type of the strained fin structures (e.g., the compressively-strained fin structures 102 or the tensile-strained fin structures 104) is created. FIG. 5B illustrates an aspect of the present disclosure where the compressively-strained fin structures 102 are created first. This may be performed by etching the fin structures 500 or by doping the fin structures 500, as desired.

Figure 5C:
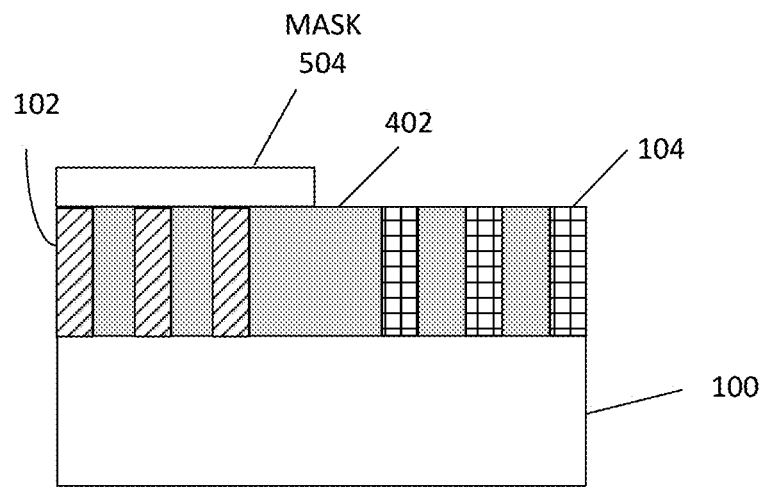
Figure 5D:
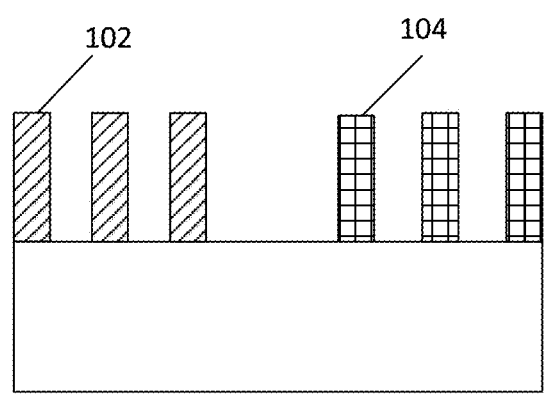

The etch mask 502 is then removed, and another mask 504 is applied. This mask 504 protects the compressively-strained fin structures 102 or the tensile-strained fin structures 104, such that the other type of strained fin structure may be fabricated. In this case, as shown in FIG. 5C, the tensile-strained fin structures 104 are created. Finally, in FIG. 5D, the isolation material in the region 402 is removed to reveal the compressively-strained fin structures 102 and the tensile-strained fin structures 104 on the substrate 100.

Figure 6:
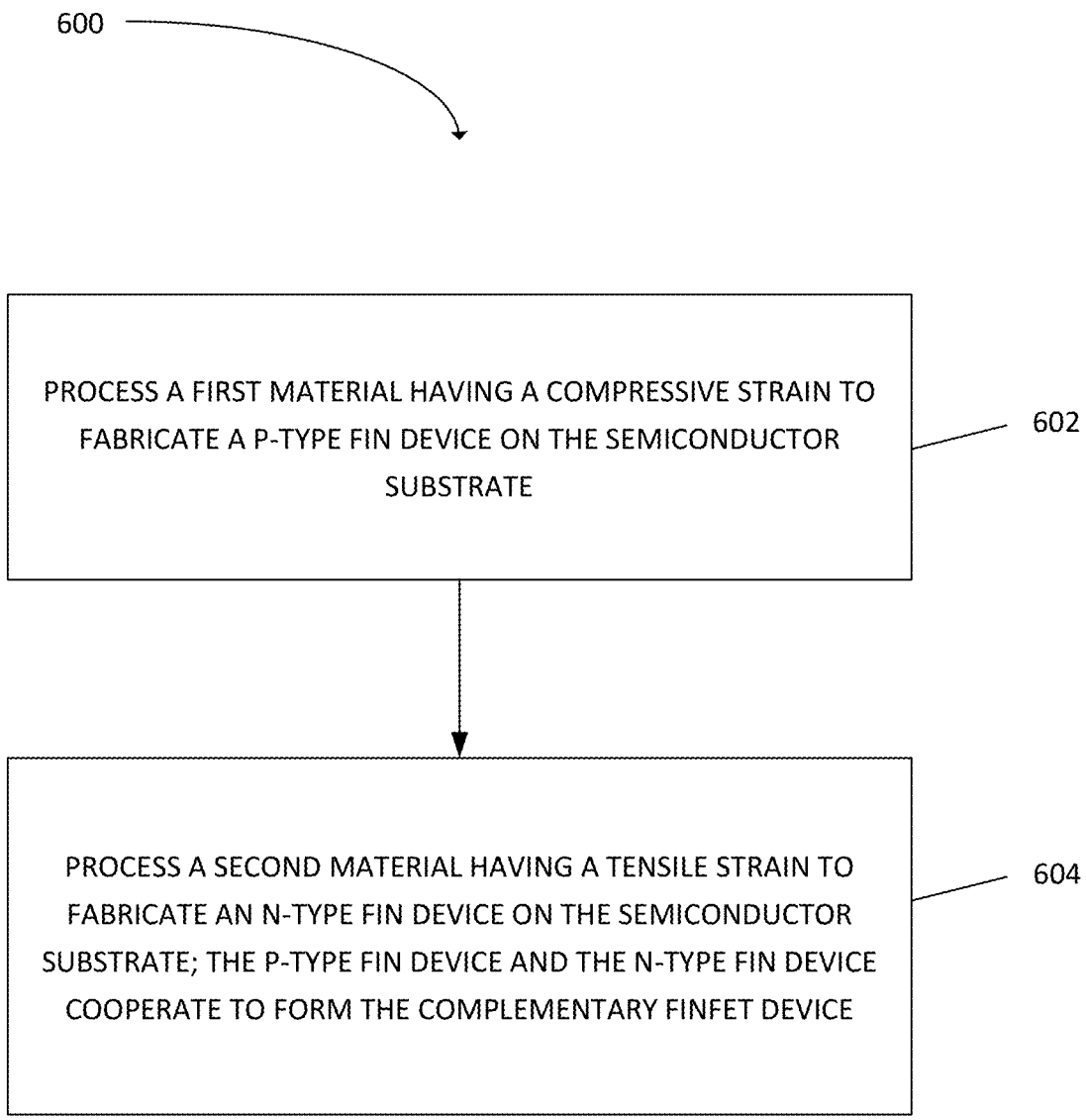
FIG. 6 is a process flow diagram illustrating a method for fabricating a complementary fin field effect transistor (FinFET) device on a semiconductor substrate according to an aspect of the present disclosure.

FIG. 6 is a process flow diagram illustrating a method 600 for fabricating a complementary fin field effect transistor (FinFET) device on a semiconductor substrate according to an aspect of the present disclosure. In block 602, a first material having a compressive strain to fabricate a p-type fin device on the semiconductor substrate is processed. In block 604, a second material having a tensile strain to fabricate an n-type fin device on the semiconductor substrate is processed. The p-type fin device and the n-type fin device cooperate to form the complementary FinFET device. The n-type device may be fabricated before or after the p-type device.

For example, in FIGS. 4A and 4B, the regions (e.g., the region of epitaxial growth 400, the region 402, and the region 404) are selectively etched to create the compressively-strained fin structures 102 and the tensile-strained fin structures 104. Alternatively, in FIGS. 5A to 5D, an isolation material in the region 402 is removed to reveal the compressively-strained fin structures 102 and the tensile-strained fin structures 104 on the substrate 100.

According to a further aspect of the present disclosure, a complementary FinFET device is described. In one configuration, The FinFET device includes a p-type device having means for carrying current comprising a first material that is lattice mismatched relative to a supporting layer. The first material has a compressive strain. The p-type current carrying means may be the compressively-strained fin structures 102. The FinFET also includes an n-type device having means for carrying current comprising a second material having a tensile strain and being lattice mismatched relative to the supporting layer. The n-type current carrying means may be the tensile-strained fin structures 104. In another aspect, the aforementioned means may be any module or any apparatus configured to perform the functions recited by the aforementioned means.

Figure 7:
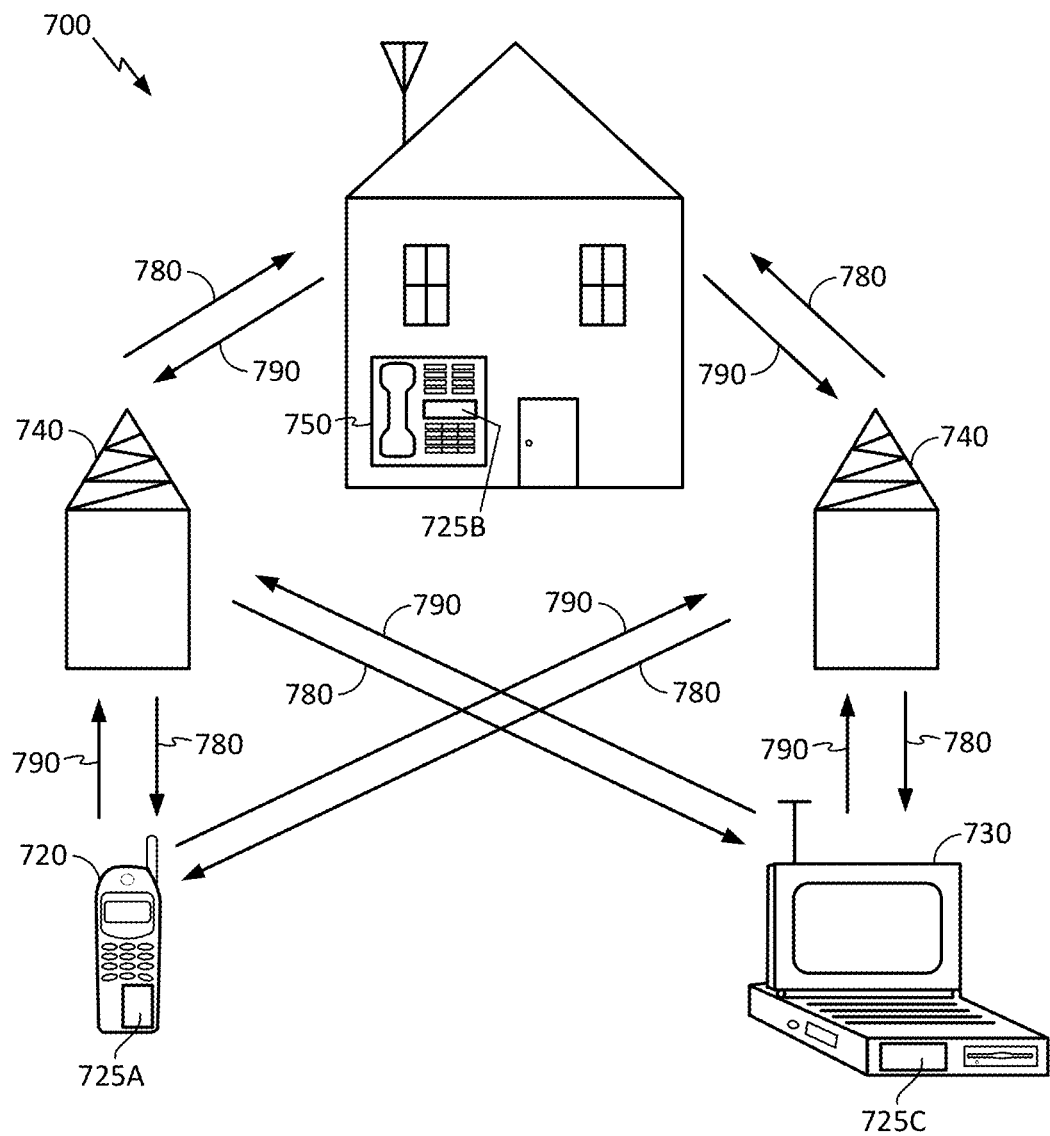
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed FinFET devices. It will be recognized that other devices may also include the disclosed FinFET devices, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed FinFET devices.

Figure 8:
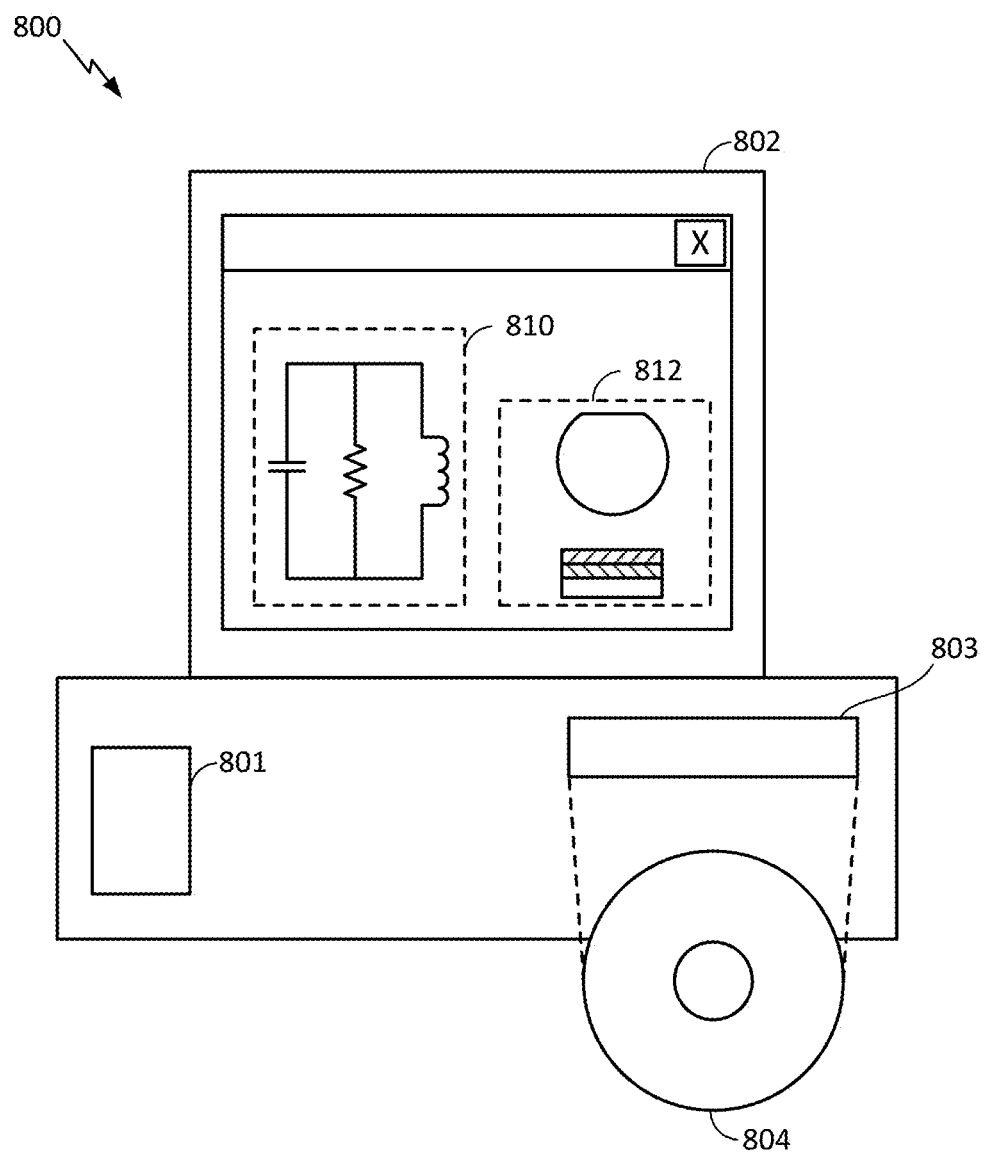
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the FinFET devices disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a FinFET device. A storage medium 804 is provided for tangibly storing the design of the circuit 810 or the semiconductor component 812. The design of the circuit 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for fabricating a complementary fin field effect transistor (FinFET) device on a semiconductor substrate, comprising:
    processing a first material having a compressive strain to fabricate a p-type fin device directly on the semiconductor substrate and having the compressive strain throughout a height of a fin of the p-type fin device; and
    processing a second material having a tensile strain to fabricate an n-type fin device directly on the semiconductor substrate and having the tensile strain throughout a height of a fin of the n-type fin device, in which the p-type fin device and the n-type fin device cooperate to form the complementary FinFET device.

2. The method of claim 1, in which the semiconductor substrate is a silicon substrate.

3. The method of claim 1, in which the first material is at least one of silicon-germanium (SiGe), germanium (Ge), and/or silicon-germanium carbon (SiGe:C).

4. The method of claim 1, in which the second material is silicon-carbon (Si:C).

5. The method of claim 1, in which the semiconductor substrate comprises an oxide layer, a nitride layer, a metal oxide layer or a silicon layer.

6. The method of claim 1, further comprising integrating the complementary FinFET device into a mobile phone, a set top box, a music player, a video player, an entertainment unit, a navigation device, a computer, a hand-held personal communication systems (PCS) unit, a portable data unit, and/or a fixed location data unit.

7. A complementary fin field-effect transistor (FinFET) device, comprising:
    a p-type device having a p-channel fin directly on a semiconductor substrate, the p-channel fin comprising a first material that is lattice mismatched relative to the semiconductor substrate, the first material having a compressive strain throughout a height of the p-channel fin; and
    an n-type device having an n-channel fin directly on the semiconductor substrate, the n-channel fin comprising a second material having a tensile strain throughout a height of the n-channel fin and being lattice mismatched relative to the semiconductor substrate, in which the p-type device and the n-type device cooperate to form the complementary FinFET device.

8. The complementary FinFET device of claim 7, in which the first material is at least one of silicon-germanium (SiGe), germanium (Ge), and/or silicon-germanium carbon (SiGe:C).

9. The complementary FinFET device of claim 7, in which the second material is silicon-carbon (Si:C).

10. The complementary FinFET device of claim 7, in which the semiconductor substrate comprises a silicon substrate.

11. The complementary FinFET device of claim 7, in which the semiconductor substrate comprises an oxide layer, a nitride layer, a metal oxide layer or a silicon layer.

12. The complementary FinFET device of claim 7 integrated into a mobile phone, a set top box, a music player, a video player, an entertainment unit, a navigation device, a computer, a hand-held personal communication systems (PCS) unit, a portable data unit, and/or a fixed location data unit.

13. A method for fabricating a complementary fin field effect transistor (FinFET) device on a semiconductor substrate, comprising:
   the step for fabricating a p-type device having a p-channel fin directly on a semiconductor substrate, the p-channel fin comprising a first material having a compressive strain throughout a height of the p-channel fin and being lattice mismatched relative to the semiconductor substrate; and
   the step for fabricating an n-type device having an n-channel fin directly on the semiconductor substrate, the n-channel fin comprising a second material having a tensile strain throughout a height of the n-channel fin and being lattice mismatched relative to the semiconductor substrate, in which the p-type device and the n-type device cooperate to form the complementary FinFET device.

14. The method of claim 13, in which the complementary FinFET device is integrated into a mobile phone, a set top box, a music player, a video player, an entertainment unit, a navigation device, a computer, a hand-held personal communication systems (PCS) unit, a portable data unit, and/or a fixed location data unit.

15. A complementary fin field-effect transistor (FinFET) device, comprising:
   a p-type device having a first means for carrying current directly on a semiconductor substrate, the first current carrying means comprising a first material that is lattice mismatched relative to the semiconductor substrate, the first material having a compressive strain throughout a height of the first current carrying means; and
   an n-type device having a second means for carrying current directly on the semiconductor substrate, the second current carrying means comprising a second material having a tensile strain throughout a height of the second current carrying means and being lattice mismatched relative to the semiconductor substrate, in which the p-type device and the n-type device cooperate to form the complementary FinFET device.

16. The complementary FinFET device of claim 15, integrated into a mobile phone, a set top box, a music player, a video player, an entertainment unit, a navigation device, a computer, a hand-held personal communication systems (PCS) unit, a portable data unit, and/or a fixed location data unit.

* * * * *